(12) United States Patent
Ali et al.

(10) Patent No.: US 7,511,552 B2
(45) Date of Patent: Mar. 31, 2009

(54) METHOD AND APPARATUS OF A LEVEL SHIFTER CIRCUIT HAVING A STRUCTURE TO REDUCE FALL AND RISE PATH DELAY

(75) Inventors: Shahid Ali, Bangalore (IN); Satheesh Balasubramanian, Bangalore (IN); Sujan Manobar, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/454,063

(22) Filed: Jun. 15, 2006

(65) Prior Publication Data

US 2007/0290735 A1 Dec. 20, 2007

(51) Int. Cl.
*H03L 5/00* (2006.01)
(52) U.S. Cl. .......................... 327/333; 326/62
(58) Field of Classification Search ................. 327/333; 326/62
See application file for complete search history.

(56) References Cited

U.S. PATENT DOCUMENTS 7,148,735 B2 * 12/2006 Ito et al. ..................... 327/333
7,239,191 B2 * 7/2007 Lee ............................ 327/333

* cited by examiner

*Primary Examiner*—Kenneth B. Wells
(74) *Attorney, Agent, or Firm*—Alan K. Stewart; W. James Brady; Frederick J. Telecky, Jr.

(57) ABSTRACT

A method, apparatus and/or system of a level shifter circuit having a structure to reduce fall and rise path delay is disclosed. In one embodiment, a level shifter circuit comprise a first set of sequentially coupled pull-up and pull-down sub-circuits cross coupled to a second set of sequentially pull-up and pull-down sub-circuits to generate a positive feedback loop; an output node coupled to a shared node between the first pull-up and pull-down sub-circuits through an output inverter; a pull-up NMOS transistor with a gate contact coupled to the input of the second set, a source contact coupled to an input of the output inverter and a drain contact coupled to the output voltage of the level shifter circuit; and a pull-down NMOS transistor with a gate contact coupled to the input of the second set, a drain contact coupled to an output of the output inverter and a source contact coupled to a ground.

4 Claims, 4 Drawing Sheets

METHOD AND APPARATUS OF A LEVEL SHIFTER CIRCUIT HAVING A STRUCTURE TO REDUCE FALL AND RISE PATH DELAY

FIELD OF TECHNOLOGY

This disclosure relates generally to the technical fields of electronics and integrated circuit (IC) technology and, in one example embodiment, to a method, apparatus and/or system of a level shifter (e.g., voltage converter) circuit having a structure to reduce fall and rise path delay.

BACKGROUND

An integrated circuit (e.g., an electronic circuit and/or an electrical system formed on a single substrate of a semiconductor material) may become denser and/or may operate at a faster speed as semiconductor technology improves due to smaller physical size of a transistor. Therefore, the integrated circuit may dissipate more power per unit area as the transistor of the integrated circuit switches logic states during operation (i.e., a dynamic power dissipation density). This dissipation of more power per unit area may result in a malfunction of the integrated circuit (e.g., because of overheating).

Although the physical size of the transistor may become smaller, a physical size of the integrated circuit may increase because improvements in technology may enable handling of larger wafer sizes. As a result, a total power dissipated by the integrated circuit may increase. An increase in the total power dissipated by the integrated circuit may reduce a battery lifetime in mobile and/or portable applications.

In addition, a reduction in a supply voltage of the integrated circuit may adversely affect a speed of the integrated circuit because the transistor may be driven by a lower supply voltage (e.g., may take more time to switch). Therefore, the integrated circuit may be divided into different voltage domains. For example, in the integrated circuit, a speed-critical circuit domain may be powered using a higher voltage and a non-speed critical circuit domain may be powered using a lower voltage. However, it may not be possible to directly connect different voltage domains without increasing a power dissipation (e.g., a dynamic and/or a static power dissipation).

A level shifter (e.g., a voltage converter, etc.) circuit may be an electronic circuit to couple different voltage domains of the integrated circuit. The level shifter may introduce several inefficiencies (e.g., additional delay, take up additional space, and/or consume additional power) in the integrated circuit. Further, some types of the level shifter circuit may increase the total power dissipated by the integrated circuit (e.g., more logic gates may have to be driven by a higher power supply).

A duty cycle distortion may also occur as a signal travels across the level shifter circuit (e.g., due to delays of a falling path and/or a rising path in the level shifter circuit). In addition, due to a process variation (e.g., changes in oxide thickness, gate length, etc.), the level shifter may fail to operate correctly. Similarly, a temperature variation (e.g., a heat generated when the integrated circuit is operating) and/or a voltage variation (e.g., a supply voltage) may also cause failure of the integrated circuit when the level shifter is used.

SUMMARY

A method, apparatus and/or system of a level shifter circuit having a structure to reduce fall and rise path delay is disclosed. In one aspect, a system includes a first circuit to operate based on a first voltage of a first power supply; a second circuit to operate based on a second voltage of a second power supply; a level shifter circuit between the first circuit and the second circuit to translate between the first voltage of the first power supply and the second voltage of the second power supply; a first set of sequentially coupled pull-up and pull-down sub-circuits of the level shifter circuit cross coupled to a second set of sequentially coupled pull-up and pull-down sub-circuits of the level shifter circuit to generate a positive feedback loop; an output node of the level shifter circuit coupled to a common node between the pull-up and the pull-down sub-circuits of the first set of sequentially coupled pull-up and pull-down sub-circuits through an output inverter; a pull-up NMOS transistor having a gate contact coupled to an input of the second set of pull-up and pull-down sub-circuits, a source contact coupled to an input of the output inverter and a drain contact coupled to the second voltage of the level shifter circuit; and a pull-down NMOS transistor having a gate contact coupled to the input of the second set of pull-up and pull-down sub-circuits, a drain contact coupled to an output of the output inverter and a source contact coupled to a ground.

The system may further reduce delays of a falling path of a signal and a rising path of the signal as compared to those of a conventional level shifter circuit. The system may further make delays of the falling path of the signal and the rising path of the signal substantially close to that of two logic stages. The system may further has a increased speed of operation due to reduced delays in the falling path and the rising path of the signal of the level shifter circuit.

The system may further reduce a power dissipation due to reduced delays of both the falling and the rising path of the signal of the level shifter circuit.

The system may further have a reduced duty cycle distortion caused by an insertion of the level shifter circuit by making delays of both the falling path and the rising path substantially close. The system may further maintain a duty cycle to be approximately 50% throughout the system by making delays of both the falling path and the rising path substantially close.

The system may further reduce an area of an integrated circuit due to a reduced size of a P-well of the level shifter circuit which has a smaller number of PMOS transistors as compared to a conventional level shifter circuit.

The system may further operate at a broader range of temperatures between −15 degrees Celsius and 65 degrees Celsius, and wherein the voltages and process variations in which the level shifter circuit operates without failure improves through the output node, the pull-up NMOS transistor, and the pull down NMOS transistor.

In another aspect, a level shifter circuit comprises a first set of sequentially coupled pull-up and pull-down sub-circuits cross coupled to a second set of sequentially coupled pull-up and pull-down sub-circuit to generate a positive feedback loop; an input node of the first set coupled to an input node of the level shifter; an input node of the second set coupled to a inverse logic of the input node of the level shifter; and an output node coupled to a shared node between the pull-up and pull-down sub-circuits of the first set through an output inverter.

In yet another aspect, a level shifter circuit comprises a first set of sequentially coupled pull-up and pull-down sub-circuits cross coupled to a second set of sequentially coupled pull-up and pull-down sub-circuits to generate a positive feedback loop; an input node of the first set of sequentially coupled pull-up and pull-down sub-circuits coupled to an input node of the level shifter; an input node of the second set of sequentially coupled pull-up and pull-down sub-circuits coupled to a logical inverse of the input node of the level shifter; an output node coupled to a shared node between the first pull-up and pull-down sub-circuits through an output inverter; a pull-up NMOS transistor with a gate contact coupled to the input of the second set of pull-up and pull-down sub-circuits, a source contact coupled to an input of the output inverter and a drain contact coupled to the output voltage of the level shifter circuit; and a pull-down NMOS transistor with a gate contact coupled to the input of the second set of pull-up and pull-down sub-circuits, a drain contact coupled to an output of the output inverter and a source contact coupled to a ground.

In yet another aspect, a method comprises generating a positive feedback loop through a cross-coupling of a first set of sequentially coupled pull-up and pull-down sub-circuits to a second set of sequentially coupled pull-up and pull-down sub-circuits; coupling a first set input node of the first set of sequentially coupled pull-up and pull-down sub-circuits to a level shifter input node; coupling a second set input node of the second set of sequentially coupled pull-up and pull-down sub-circuits to a inverse logic of the level shifter input node; coupling a level shifter output node to a shared node between a first pull-up sub-circuit and a first pull-down sub-circuit of the first set of sequentially coupled pull-up and pull-down sub-circuits through an output inverter; placing a pull-up NMOS transistor having a gate contact coupled to the second set input node of the second set of pull-up and pull-down sub-circuits, a source contact coupled to an output inverter input node and a drain contact coupled to a level shifter output voltage; placing a pull-down NMOS transistor with a gate contact coupled to the second set input node of the second set of pull-up and pull-down sub-circuits, a drain contact coupled to an output inverter output node and a source contact coupled to a ground.

In yet another aspect, a method of design of an integrated circuit comprises reducing a rise path delay of the integrated circuit through a level shifter circuit design having a an output node coupled to a logical inverse of a shared node between a first pull-up sub-circuit and a first pull-down sub-circuit of the first set of sequentially coupled pull-up and pull-down sub-circuits which is cross coupled to a second set of sequentially coupled pull-up and pull-down sub-circuits circuits; reducing a fall path delay of the integrated circuit through a reduction in a capacitive discharge time of the output node of the level shifter circuit and a reduction in a capacitive charge time of the shared node between the first pull-up sub-circuit and the first pull-down sub-circuit of the first set of sequentially coupled pull-up and pull-down sub-circuits through a placement of a pull-down NMOS transistor and a pull-up NMOS transistor in a fall path of the level shifter circuit.

BRIEF DESCRIPTION OF THE DRAWINGS

Example embodiments are illustrated by way of example and not limitation in the figures of the accompanying drawings, in which like references indicate similar elements and in which.

Figure 1:
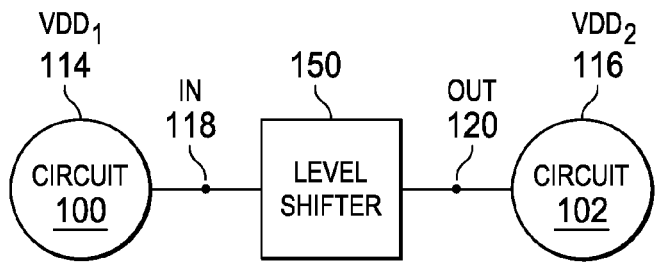
FIG. 1 is a schematic diagram of a level shifter circuit between a circuit with a first power supply voltage and a circuit with a second power supply voltage, according to one embodiment.

Other features of the present embodiments will be apparent from the accompanying drawings and from the detailed description that follows.

DETAILED DESCRIPTION

A method, apparatus and/or system of a level shifter circuit with improved performance is disclosed. In the following description, for the purposes of explanation, numerous specific details are set forth in order to provide a thorough understanding of the various embodiments. It will be evident, however, to one skilled in the art that the various embodiments may be practiced without these specific details.

In one embodiment, a system includes a first circuit to operate based on a first voltage of a first power supply (e.g., a circuit 100 of FIG. 1); a second circuit to operate based on a second voltage of a second power supply (e.g., a circuit 102 of FIG. 1); a level shifter circuit (e.g., a level shifter 450 of FIG. 4) between the first circuit and the second circuit to translate between the first voltage of the first power supply and the second voltage of the second power supply; a first set of sequentially coupled pull-up and pull-down sub-circuits of the level shifter circuit cross coupled to a second set of sequentially coupled pull-up and pull-down sub-circuits of the level shifter circuit to generate a positive feedback loop; an output node of the level shifter circuit coupled to a common node between the pull-up and the pull-down sub-circuits of the first set of sequentially coupled pull-up and pull-down sub-circuits through an output inverter; a pull-up NMOS transistor having a gate contact coupled to an input of the second set of pull-up and pull-down sub-circuits, a source contact coupled to an input of the output inverter and a drain contact coupled to the second voltage of the level shifter circuit; and a pull-down NMOS transistor having a gate contact coupled to the input of the second set of pull-up and pull-down sub-circuits, a drain contact coupled to an output of the output inverter and a source contact coupled to a ground (e.g., as described in FIG. 4).

In another embodiment, level shifter circuit (e.g., the level shifter 350 of FIG. 3 and FIG. 4) includes a first set of sequentially coupled pull-up and pull-down sub-circuits cross coupled to a second set of sequentially coupled pull-up and pull-down sub-circuit to generate a positive feedback loop; an input node of the first set coupled to an input node of the level shifter; an input node of the second set coupled to a inverse logic of the input node of the level shifter; and an output node coupled to a shared node between the pull-up and pull-down sub-circuits of the first set through an output inverter (e.g., as described in FIG. 3 and FIG. 4).

In yet another embodiment, a level shifter circuit (e.g., the level shifter 450 of FIG. 4), comprising a first set of sequentially coupled pull-up and pull-down sub-circuits cross coupled to a second set of sequentially coupled pull-up and pull-down sub-circuits to generate a positive feedback loop; an input node of the first set of sequentially coupled pull-up and pull-down sub-circuits coupled to an input node of the level shifter; an input node of the second set of sequentially coupled pull-up and pull-down sub-circuits coupled to a logical inverse of the input node of the level shifter; an output node coupled to a shared node between the first pull-up and pull-down sub-circuits through an output inverter (e.g., as described in FIG. 3 and FIG. 4); a pull-up NMOS transistor with a gate contact coupled to the input of the second set of pull-up and pull-down sub-circuits, a source contact coupled to an input of the output inverter and a drain contact coupled to the output voltage of the level shifter circuit; and a pull-down NMOS transistor with a gate contact coupled to the input of the second set of pull-up and pull-down sub-circuits, a drain contact coupled to an output of the output inverter and a source contact coupled to a ground (e.g., as described in FIG. 4).

In a further embodiment, a method includes generating a positive feedback loop through a cross-coupling of a first set of sequentially coupled pull-up and pull-down sub-circuits to a second set of sequentially coupled pull-up and pull-down sub-circuits (e.g., as illustrated in FIGS. 2-4); coupling a first set input node of the first set of sequentially coupled pull-up and pull-down sub-circuits to a level shifter input node; coupling a second set input node of the second set of sequentially coupled pull-up and pull-down sub-circuits to a inverse logic of the level shifter input node; coupling a level shifter output node to a shared node between a first pull-up sub-circuit and a first pull-down sub-circuit of the first set of sequentially coupled pull-up and pull-down sub-circuits through an output inverter (e.g., as described in FIG. 3 and FIG. 4); placing a pull-up NMOS transistor having a gate contact coupled to the second set input node of the second set of pull-up and pull-down sub-circuits, a source contact coupled to an output inverter input node and a drain contact coupled to a level shifter output voltage; and placing a pull-down NMOS transistor with a gate contact coupled to the second set input node of the second set of pull-up and pull-down sub-circuits, a drain contact coupled to an output inverter output node and a source contact coupled to a ground (e.g., as described in FIG. 4).

Figure 5:
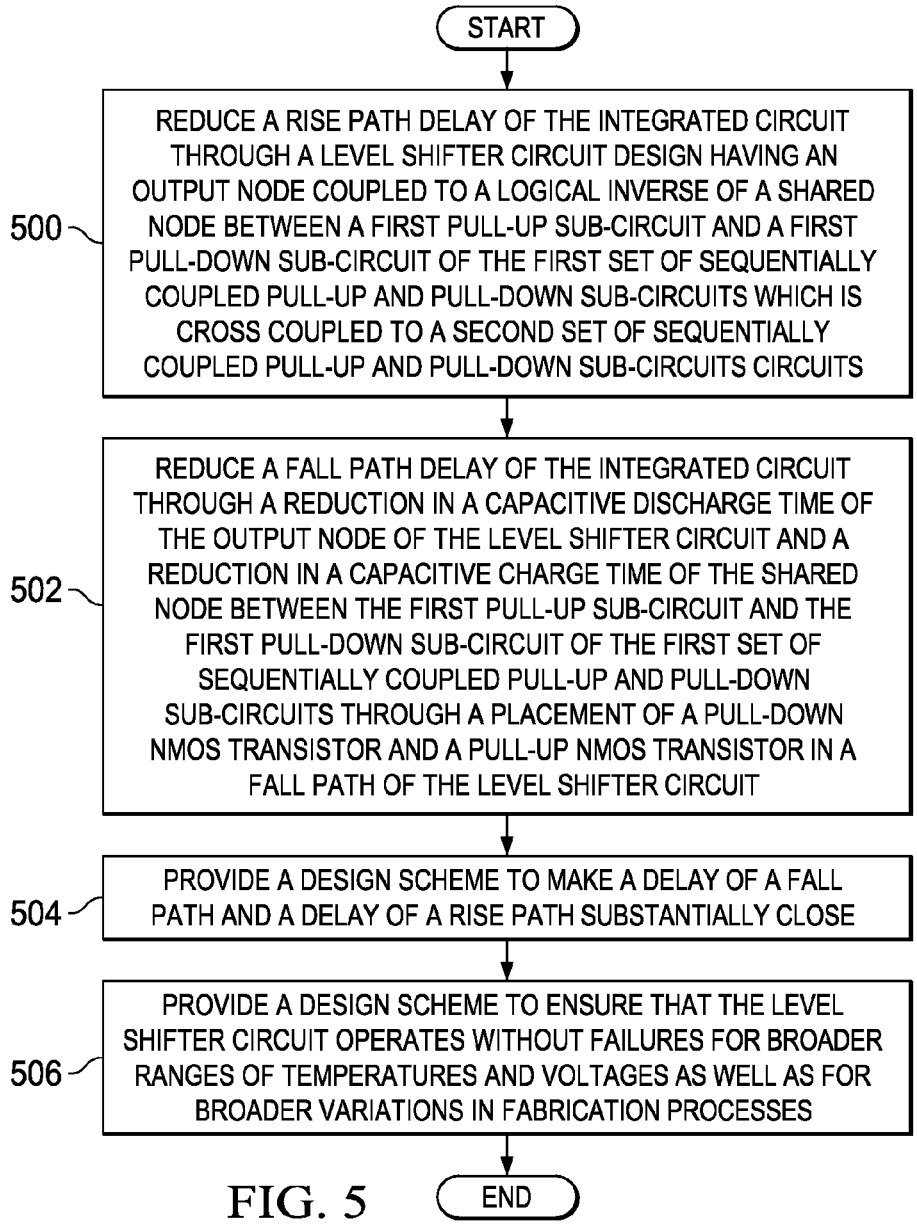
FIG. 5 is a process flow of reducing a fall path delay and a rise path delay of an integrated circuit, according to the one embodiment and/or the another embodiment.

In yet a further embodiment, method of design of an integrated circuit includes reducing a rise path delay of the integrated circuit through a level shifter circuit design having a an output node coupled to a logical inverse of a shared node between a first pull-up sub-circuit and a first pull-down sub-circuit of the first set of sequentially coupled pull-up and pull-down sub-circuits which is cross coupled to a second set of sequentially coupled pull-up and pull-down sub-circuits circuits; and reducing a fall path delay of the integrated circuit through a reduction in a capacitive discharge time of the output node of the level shifter circuit and a reduction in a capacitive charge time of the shared node between the first pull-up sub-circuit and the first pull-down sub-circuit of the first set of sequentially coupled pull-up and pull-down sub-circuits through a placement of a pull-down NMOS transistor and a pull-up NMOS transistor in a fall path of the level shifter circuit (e.g., as described in FIG. 5).

FIG. 1 is a schematic diagram of a system which includes a first circuit (e.g., circuit 100) to operate based on a first voltage (e.g., a voltage $VDD_1$ 114) of a first power supply, a second circuit (e.g., a circuit 102) to operate based on a second voltage (e.g., a voltage $VDD_2$ 116) of a second power supply, a level shifter circuit (e.g., a level shifter 150) between the first circuit and the second circuit to translate between the first voltage of the first power supply and the second voltage of the second power supply, according to one embodiment.

The level shifter circuit 150 may translate (e.g., shift, increase, decrease, etc.) an output signal level of a circuit (e.g., the circuit 100) operating at the first power supply voltage (e.g., the voltage $VDD_1$ 114) to the second power supply voltage (e.g., the voltage $VDD_2$ 116) of another circuit (e.g., the circuit 102), and vice versa. In one embodiment, the circuit 100 may be a number of circuits (e.g., a power supply system, an LCD display, a transducer etc.). The circuit 102 may also be a number of circuits (e.g., a phase lock loop, a controller, an A/D converter, etc.). The voltage $VDD_1$ 114 may be higher or lower than the voltage $VDD_2$ 116 in one embodiment.

Figure 2A:
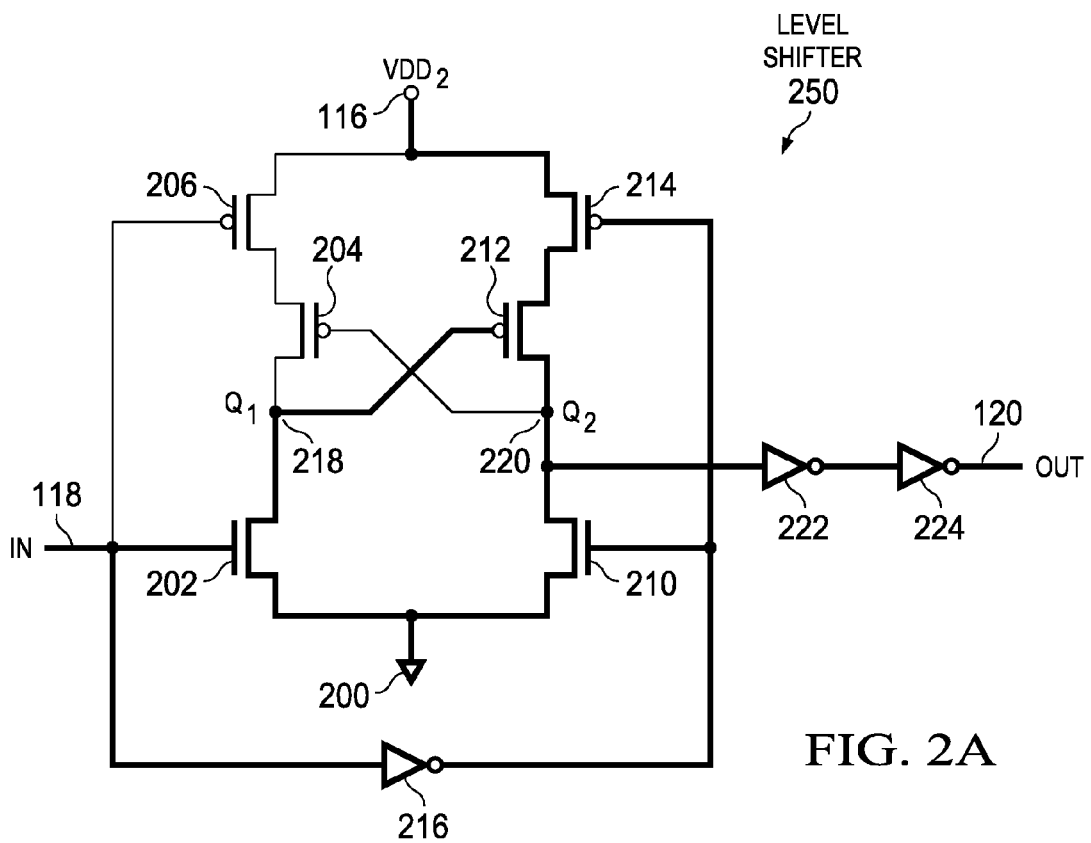
FIG. 2A is a transistor level exploded view diagram highlighting a rise path of the level shifter circuit of FIG. 1, according to one embodiment.
Figure 2B:
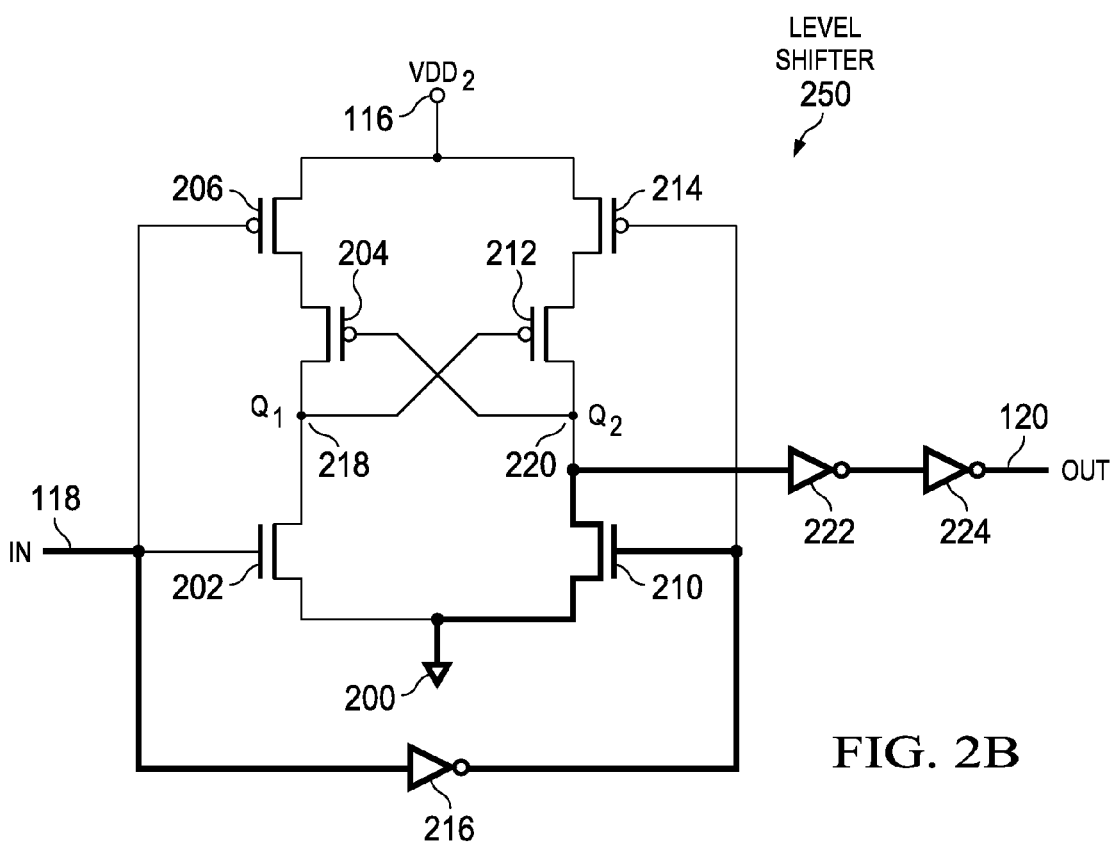
FIG. 2B is a transistor level exploded view diagram highlighting a fall path of the level shifter circuit of FIG. 1, according to one embodiment.
Figure 3A:
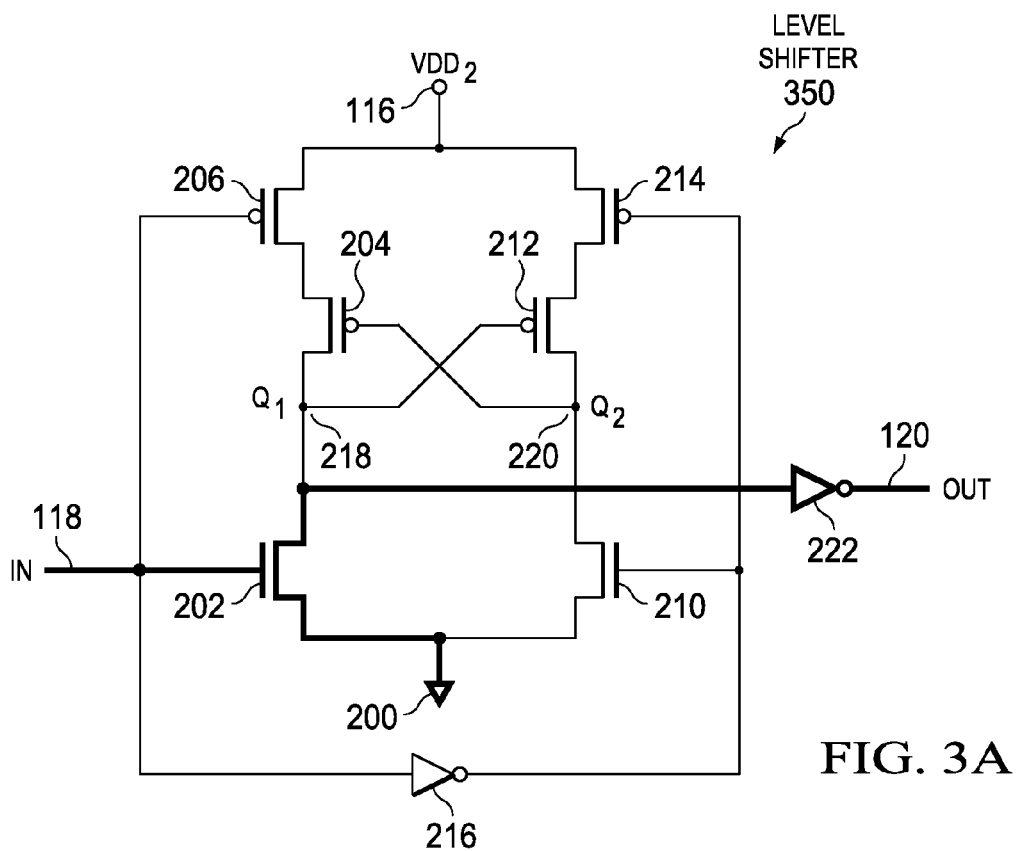
FIG. 3A is a transistor level exploded view diagram highlighting the rise path of the level shifter circuit of FIG. 1, according to another embodiment.
Figure 3B:
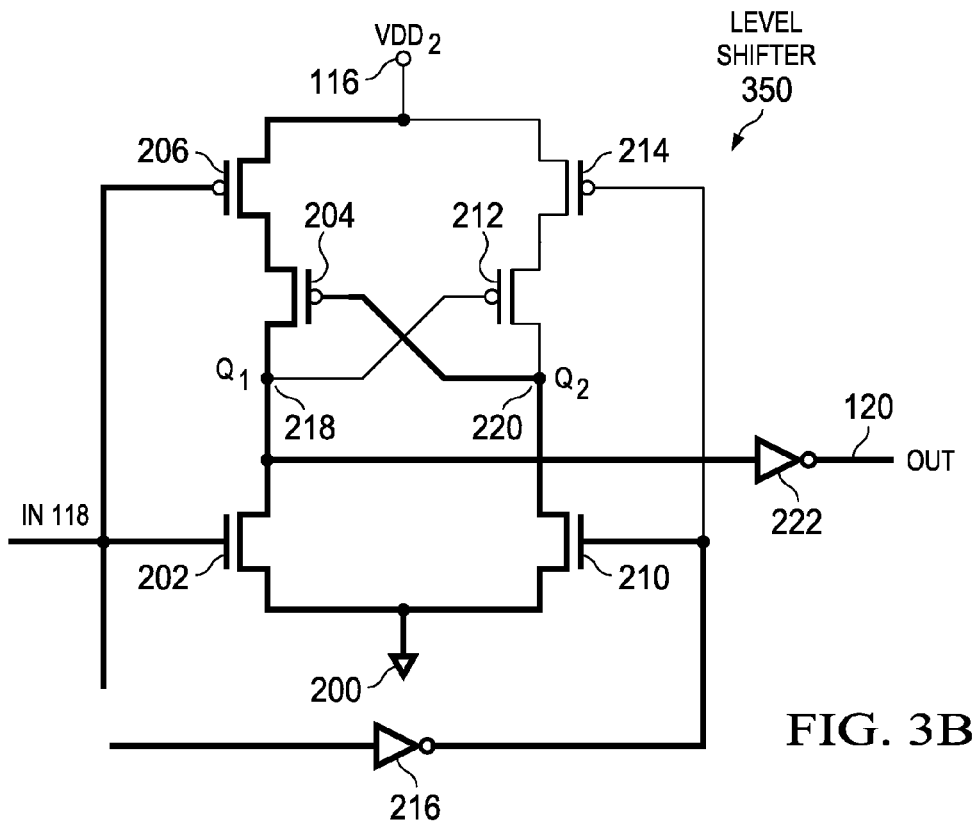
FIG. 3B is a transistor level exploded view diagram highlighting the fall path of the level shifter circuit of FIG. 1, according to another embodiment.
Figure 4A:
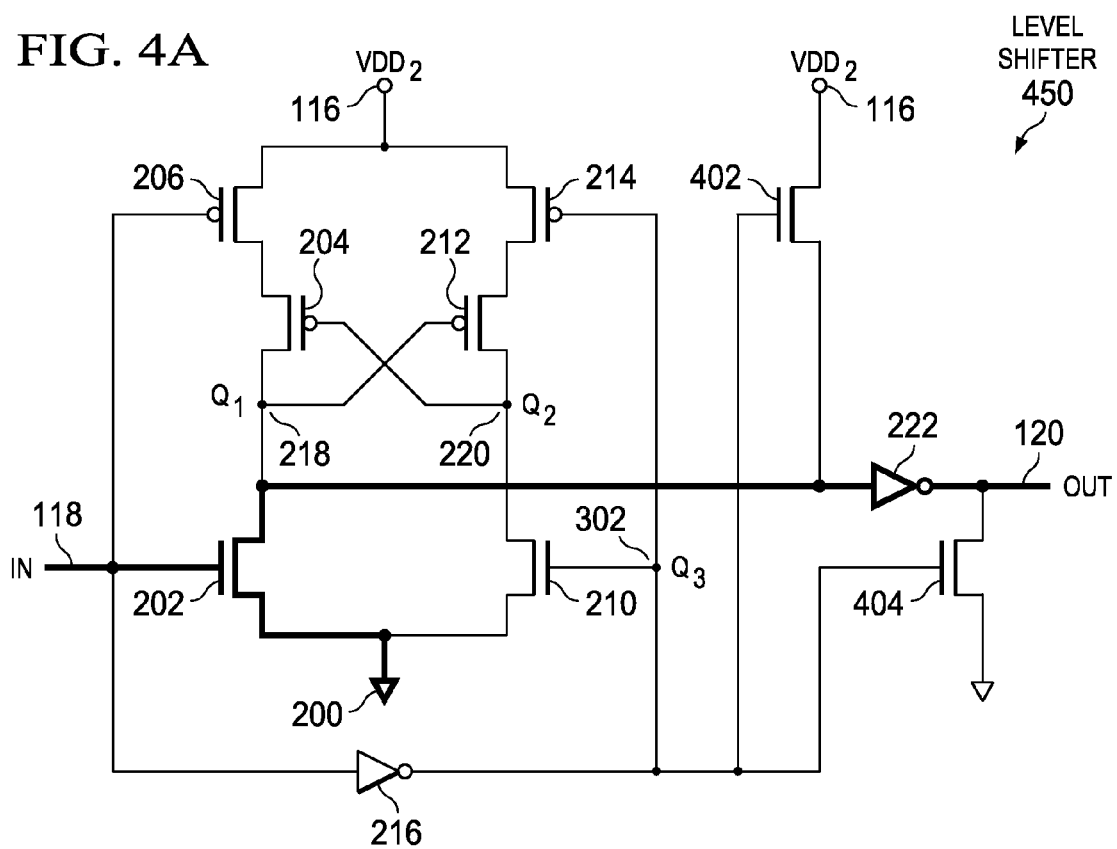
FIG. 4A is a transistor level exploded view diagram highlighting the rise path of the level shifter circuit of FIG. 1, according to another embodiment.
Figure 4B:
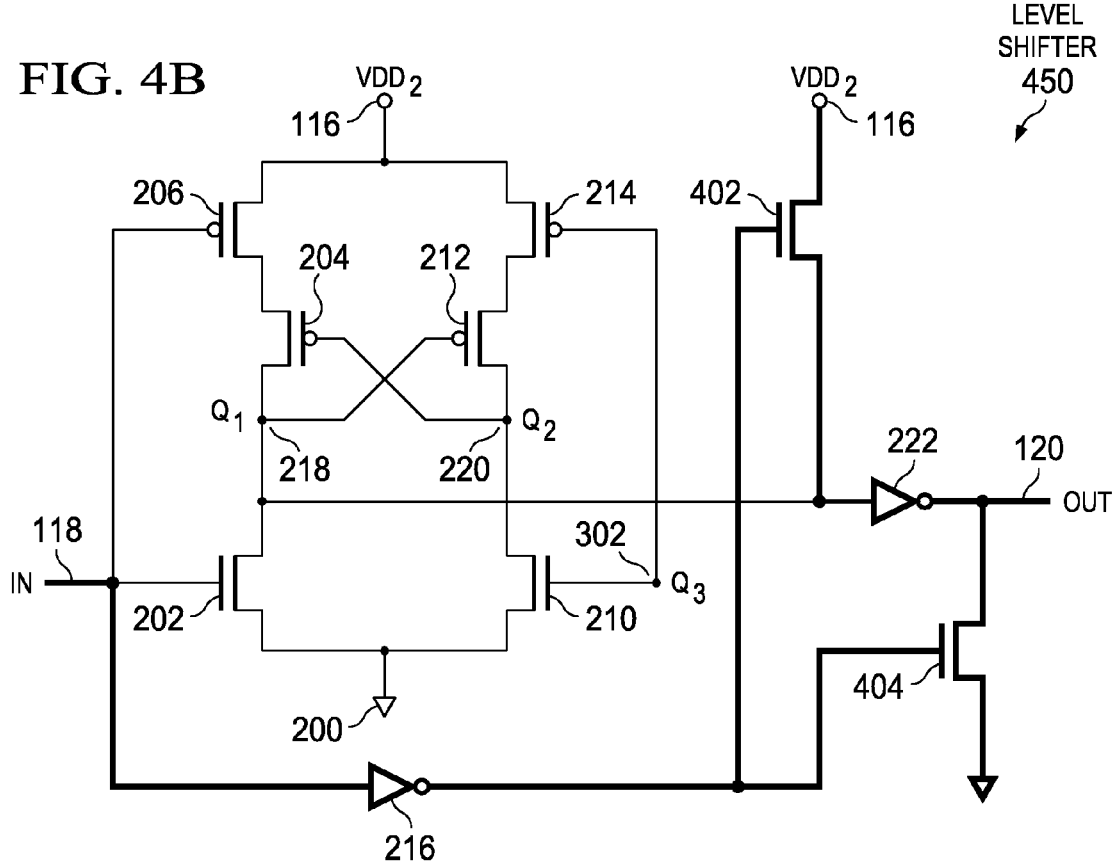
FIG. 4B is a transistor level exploded view diagram highlighting the fall path of the level shifter circuit of FIG. 1, according to another embodiment.

FIG. 2A and FIG. 2B are transistor level exploded view diagrams of a level shifter circuit (e.g., circuit 250 of FIG. 2). FIG. 3A and FIG. 3B are transistor level exploded view diagrams of one embodiment of the level shifter circuit (e.g., circuit 350 of FIG. 3). FIG. 4A and FIG. 4B are transistor level exploded view diagrams of another embodiment of the level shifter circuit (e.g., circuit 450 of FIG. 4).

A metal-oxide-semiconductor (MOS) transistor may have either p-type (e.g., in a PMOS transistor) or n-type (e.g., in a NMOS transistor) conductive channel of the MOS transistor during operation. A threshold voltage marks the formation of this conductive channel in the MOS transistor and may thus enable current conduction. The NMOS transistor and the PMOS transistor may act as a switch in an integrated circuit (e.g., a sensor, a level shifter, an LCD display, an A/D converter, a phase lock loop, etc.) as the MOS transistor may only conduct significant current for operation (e.g., in a saturation region) when a certain threshold voltage on a gate contact has been reached. A current level of the MOS transistor may also be dependent on voltages applied to three other terminals of the MOS transistor (e.g., a drain, a source, and a body).

The level shifter circuit (e.g., circuit 250 of FIG. 2A or FIG. 2B) may comprise of a first set of sequentially coupled pull-up and pull-down sub-circuits cross coupled to a second set of sequentially coupled pull-up and pull-down sub-circuit to generate a positive feedback loop. The first set of sequentially coupled pull-up and pull-down sub-circuits may comprise of a first pull-up sub-circuit (e.g., a set of two PMOS transistors 204 and 206) sequentially coupled to a first pull-down sub-circuit (e.g., a NMOS transistor 202). The second set of sequentially coupled pull-up and pull-down sub-circuits may comprise of a second pull-up sub-circuit (e.g., a set of two PMOS transistors 212 and 214) sequentially coupled to a second pull-down sub-circuit (e.g., a NMOS transistor 210). A first set input node (e.g., the gate contact of the NMOS transistor 202) may be coupled to the level shifter input node (e.g., the circuit node 118) and a second set input node (e.g., the gate contact of the NMOS transistor 210) may be coupled to a logical inverse of the level shifter input node (e.g., the circuit node 118). The logical inverse of the level shifter input node (e.g., the circuit node 118) may be obtained by passing a level shifter input signal through an inverter (e.g., 216).

In order to complete the positive feedback loop, a common node (e.g. the node $Q_1$ 218) between the first pull-up sub-circuit and the first pull-down sub-circuit of the first set of sequentially coupled pull-up and pull-down sub-circuits may be coupled to the gate contact of PMOS transistor 212 while a common node (e.g. the node $Q_2$ 220) between the second pull-up sub-circuit and the second pull-down sub-circuit of the second set of sequentially coupled pull-up and pull-down sub-circuits may be coupled to the gate contact of PMOS transistor 204.

FIG. 2A is the transistor level exploded view diagram highlighting a rise path of the level shifter circuit, in one embodiment. The rise path may comprise of a set of devices that may be active during initial stages of a low voltage to a high voltage transition at an input node of the level shifter circuit (e.g., as illustrated by a circuit node 118) which may result in a low voltage to a high voltage transition at an output node of the level shifter circuit (e.g., as illustrated another circuit node 120).

The output node of the level shifter circuit may oscillate between a voltage of a ground node (e.g. circuit node 200) and the voltage of the second power supply (e.g., $VDD_2$ 116) as the input node of the level shifter circuit oscillates between a voltage of the ground node and the voltage of the first power supply (e.g., $VDD_1$ 114). In the level shifter circuit, the rise path may include NMOS transistors 202 and 210, PMOS transistors 212 and 214, inverter 216 and output buffers 222 and 224.

During the low voltage to the high voltage transition at the input of the level shifter circuit 250 (e.g., as illustrated by a circuit node 118), the voltages of every circuit node of the level shifter circuit may switch from one stable state to another stable state. When input node of the level shifter circuit is stable at the low voltage, NMOS transistor 202 and PMOS transistors 212 and 214 may be in a non-conducting state (i.e. an OFF state) while NMOS transistor 210 and PMOS transistors 204 and 206 may be in a conducting state (i.e. a ON state).

As a result, voltage at the node $Q_1$ 218 may remain stable at the high voltage of $VDD_2$ 116 while the voltage at the node $Q_2$ 220 may remain stable at the low voltage of ground node 200. During initial stages of a low to high transition at the node IN 118, NMOS transistor 202 may switch ON and may try to pull the node $Q_1$ 218 towards the low voltage level. In doing so, NMOS transistor 202 may compete with the PMOS transistor 204 which may still be ON and may try to pull the node Q1 218 at a contradictory high voltage level. After one stage of logic delay, NMOS transistor 210 may switch OFF, PMOS transistor 214 may switch ON and the PMOS transistor 212 may partially switch ON. As a result, PMOS transistors 212 and 214 may try to pull the node $Q_2$ 220 towards high voltage level $VDD_2$ 116. After two stages of logic delay node $Q_2$ 220 may make a partial transition towards high voltage $VDD_2$ 116. Adding additional two stages of delay due to output buffers 222 and 224, output node OUT 120 may make a partial transition towards high voltage $VDD_2$ 116 after four stages of delay.

This transition towards a stable state may not be complete when competition between PMOS transistor 204 and NMOS transistor 202 is still occurring. During the latter stages of the transition, movement of node $Q_2$220 towards high voltage $VDD_2$ 116 may provide a positive feedback to the first set of pull-up and pull-down sub-circuits by helping switching OFF the PMOS transistor 204. Node $Q_2$220 may reach a stable state after a finite amount of time when NMOS transistor is able to pull the node $Q_1$ 218 complete to the ground level against continuously dwindling competition form PMOS transistor 204. As temperature, voltages and/or the fabrication process vary over broad ranges, NMOS transistor 202 may take very long (or may never be able) to overcome the competition from PMOS transistor 204. This may increase the delay before OUT 120 reaches a stable state which may, in turn, may result in a failure of the integrated circuit.

FIG. 2B is the transistor level exploded view diagram highlighting a fall path of the level shifter circuit, in one embodiment. The fall path may include of a set of devices that may be active during initial stages of a high voltage to a low voltage transition at the input node of the level shifter circuit (e.g., as illustrated by a circuit node 118) which may result in a high voltage to a low voltage transition at the output node of the level shifter circuit (e.g., as. illustrated another circuit node 120). In the level shifter circuit of FIG. 2, the fall path may include NMOS transistor 210, inverter 216 and output buffers 222 and 224.

During the high to low transition at the input of the level shifter circuit 250 (e.g., as illustrated by a circuit node 118), the voltages of every circuit node of the level shifter circuit may switch from one stable state to another stable state. When input node of the level shifter circuit is at stable high voltage, NMOS transistor 202 and PMOS transistors 212 and 214 may be in the conducting state (i.e. the ON state) while NMOS transistor 210 and PMOS transistors 204 and 206 may be in the non-conducting state (i.e. the OFF state). As a result, voltage at the node $Q_1$ 218 may remain stable at the low voltage of ground node 200 while the voltage at the node $Q_2$ 220 may remain stable at the high voltage of $VDD_2$ 116.

During initial stages of the high to low transition at the node IN 118, NMOS transistor 210 may switch ON and may try to pull the node $Q_2$ 220 towards the low voltage. In doing so, NMOS transistor 210 may compete with the PMOS transistor 212 which may still be ON and may try to pull the node $Q_2$ 220 at a contradictory high voltage level. After two stages of logic delay node $Q_2$ 220 may make a partial transition towards low voltage. Adding additional two stages of delay due to output buffers 222 and 224, output node OUT 120 may make a partial transition towards low voltage after four stages of delay.

This transition towards a stable state may not be complete while competition between PMOS transistor 212 and NMOS transistor 210 is still occurring. During the latter stages of the transition, movement of node $Q_1$ 218 towards high voltage $VDD_2$ 116 may provide a positive feedback to the second set of pull-up and pull-down sub-circuits by helping switching OFF the PMOS transistor 212. Node $Q_2$220 may reach a stable state after finite amount of time when NMOS transistor is able to pull the node $Q_2$ 220 complete to the ground level against continuously dwindling competition form the PMOS transistor 212. As temperature, voltages and/or the fabrication process varies over broad range, NMOS transistor 210 may take very long (or may never be able) to over come the competition from PMOS transistor 212. This may increase the delay before OUT 120 reaches a stable state which may, in turn, may result in a failure of the integrated circuit.

FIG. 3A and FIG. 3B are transistor level exploded view diagrams of one embodiment of the level shifter circuit (e.g., circuit 350 of FIG. 3). In one embodiment, the level shifter circuit (e.g., circuit 350 of FIG. 3A or FIG. 3B) may include of a first set of sequentially coupled pull-up and pull-down sub-circuits cross coupled to a second set of sequentially coupled pull-up and pull-down sub-circuit to generate a positive feedback loop. The first set of sequentially coupled pull-up and pull-down sub-circuits may include of a first pull-up sub-circuit (e.g., a set of two PMOS transistors 204 and 206) sequentially coupled to a first pull-down sub-circuit (e.g., a NMOS transistor 202). The second set of sequentially coupled pull-up and pull-down sub-circuits may include of a second pull-up sub-circuit (e.g., a set of two PMOS transistors 212 and 214) sequentially coupled to a second pull-down sub-circuit (e.g., a NMOS transistor 210).

A first set input node (e.g., the gate contact of the NMOS transistor 202) may be coupled to the level shifter input node (e.g., the circuit node 118) and a second set input node (e.g., the gate contact of the NMOS transistor 210) may be coupled to a logical inverse of the level shifter input node (e.g., the circuit node 118). The logical inverse of the level shifter input node (e.g., the circuit node 118) may be obtained by passing a level shifter input signal through an inverter (e.g., 216). In order to complete the positive feedback loop, a common node (e.g. the node $Q_1$ 218) between the first pull-up sub-circuit and the first pull-down sub-circuit of the first set of sequentially coupled pull-up and pull-down sub-circuits may be coupled to the gate contact of PMOS transistor 212 while a common node (e.g. the node $Q_2$ 220) between the second pull-up sub-circuit and the second pull-down sub-circuit of the second set of sequentially coupled pull-up and pull-down sub-circuits may be coupled to the gate contact of PMOS transistor 204. The output node OUT 120 may be coupled to the common node $Q_1$ 218 through the output buffers 222 (e.g., may be inverters).

FIG. 3A is the transistor level exploded view diagram highlighting the rise path of the level shifter circuit, in one embodiment. In one embodiment, the rise path may include NMOS transistor 202 and output buffer 222.

During the low to high transition at the node IN 118, NMOS transistor 202 may switch ON and may try to pull the node $Q_1$ 218 towards low voltage. Adding additional one stage of delay due to output buffer 222, output node OUT 120 may make transition towards high voltage $VDD_2$ 116 after two stages of delay. The level shifter circuit may include a reduced delay of a rising path of a signal of the level shifter circuit. In one embodiment, the delay of the rising path of the signal of the level shifter circuit may substantially be close to that of two stages of logic.

FIG. 3B is the transistor level exploded view diagram highlighting the fall path of the level shifter circuit 350, in one embodiment. In one embodiment, the fall path may include NMOS transistors 202 and 210, PMOS transistors 206 and 204, inverter 216 and output buffers 222 and 224.

During initial stages of high to low transition at the node IN 118, NMOS transistor 202 may switch OFF and PMOS transistor 206 may switch ON. After one stage of logic delay, NMOS transistor 210 may switch ON and may try to pull the node $Q_2$ 220 towards the low voltage. In doing so, it may compete with PMOS transistor 212 which may still be ON and may try to pull the node $Q_2$ 220 at contradictory high voltage level. After two stages of logic delay node $Q_2$ 220 may make a partial transition towards low voltage. This may partially switch ON the PMOS transistor 204. After three stages of logic delay $Q_1$ 218 may make a partial transition towards high voltage. Adding additional one stage of delay due to output buffers 222, output node OUT 120 may make a partial transition towards low voltage after four stages of delay.

FIG. 4A and FIG. 4B are transistor level exploded view diagrams of another embodiment of the level shifter circuit (e.g., circuit 450 of FIG. 4). In one embodiment, the level shifter circuit (e.g., 450 of FIG. 4A or FIG. 4B) may include of a first set of sequentially coupled pull-up and pull-down sub-circuits cross coupled to a second set of sequentially coupled pull-up and pull-down sub-circuit to generate a positive feedback loop. The first set of sequentially coupled pull-up and pull-down sub-circuits may include of a first pull-up sub-circuit (e.g., a set of two PMOS transistors 204 and 206) sequentially coupled to a first pull-down sub-circuit (e.g., a NMOS transistor 202).

The second set of sequentially coupled pull-up and pull-down sub-circuits may include of a second pull-up sub-circuit (e.g., a set of two PMOS transistors 212 and 214) sequentially coupled to a second pull-down sub-circuit (e.g., a NMOS transistor 210). A first set input node (e.g., the gate contact of the NMOS transistor 202) may be coupled to the level shifter input node (e.g., the circuit node 118) and a second set input node (e.g., the gate contact of the NMOS transistor 210) may be coupled to a logical inverse of the level shifter input node (e.g., the circuit node 118). The logical inverse of the level shifter input node (e.g., the circuit node 118) may be obtained by passing a level shifter input signal through an inverter (e.g., 216). In order to complete the positive feedback loop, a common node (e.g. the node $Q_1$ 218) between the first pull-up sub-circuit and the first pull-down sub-circuit of the first set of sequentially coupled pull-up and pull-down sub-circuits may be coupled to the gate contact of PMOS transistor 212 while a common node (e.g. the node $Q_2$ 220) between the second pull-up sub-circuit and the second pull-down sub-circuit of the second set of sequentially coupled pull-up and pull-down sub-circuits may be coupled to the gate contact of PMOS transistor 204.

The output node OUT 120 may be coupled to the common node $Q_1$ 218 through the output buffers 222. In one embodiment, the level shifter circuit may further include of a pull-up NMOS transistor (e.g., NMOS transistor 402) may having a gate contact coupled to the input of the second set of pull-up and pull-down sub-circuits, a source contact coupled to the input of the output inverter and a drain contact coupled to the second voltage of the level shifter circuit and a pull-down NMOS transistor (e.g., NMOS transistor 404) may having a gate contact coupled to the input of the second set of pull-up and pull-down sub-circuits, a drain contact coupled to the output of the output inverter and a source contact coupled to the ground.

FIG. 4A is the transistor level exploded view diagram highlighting the rise path of the level shifter circuit, in another embodiment. In one embodiment, the rise path may include NMOS transistor 202 and output buffer 222.

During the low to high transition at the node IN 118, NMOS transistor 202 may switch ON and may try to pull the node $Q_1$ 218 towards low voltage. Adding additional one stage of delay due to output buffer 222, output node OUT 120 may make a transition towards high voltage $VDD_2$ 116 after two stages of delay.

FIG. 4B is the transistor level exploded view diagram highlighting the fall path of the level shifter circuit 450, in another embodiment. In one embodiment, the fall path may include NMOS transistors 402 and 404, inverter 216 and output buffer 222.

During the high to low transition at the input of the level shifter circuit 450 (e.g., as illustrated by a circuit node 118 of FIG. 4B), the voltages of every circuit node of the level shifter circuit may switch from one stable state to another stable state. When input node of the level shifter circuit is at stable high voltage, NMOS transistor 202 and PMOS transistors 212 and 214 may be in the conducting state (i.e. the ON state) while NMOS transistor 210 and PMOS transistors 204 and 206 may be in the non-conducting state (i.e. the OFF state).

As a result, voltage at the node $Q_1$ 218 may remain stable at the low voltage of ground node 200 while the voltage at the node $Q_2$ 220 may remain stable at the high voltage of $VDD_2$ 116. During a high to low transition at the node IN 118, NMOS transistors 402 and 404 may switch ON and may try to pull the node $Q_1$ 218 towards the high voltage and the node OUT 120 may make a transition towards the low voltage after two stages of delay.

The level shifter circuit may further include a reduced delay of the falling path of a signal and the rising path of the signal as compared to those of a conventional level shifter circuit. In one embodiment, the delay of the falling path of the signal and the rising path of the signal may substantially be close to each other. Further, the delay of both the falling path and the rising path of the level shifter circuit may substantially be close to that of two logic stages. A speed of operation may be increased due to a reduced delay in the falling path and the rising path of the signal of the level shifter circuit. Further, in one embodiment, the system may further include a reduced power dissipation in the system due to the reduced delay of both the falling and the rising path of signal of the level shifter circuit.

In one embodiment, the level shifter circuit may include a broader ranges of temperatures, voltages and process variations for which the level shifter circuit may operate without failure. Because of the $VDD_2$ 116 drive NMOS transistor 402, output node OUT 120 may always be able to reach complete high voltage level of $VDD_2$ 116 as well as the low voltage level of ground node 200. This may result in reduced chances of functional failures even at a broader ranges of temperatures, voltages and process variations.

In one embodiment, a duty cycle distortion of the level shifter may be reduced by making the delay of both the falling path and the rising path substantially close. Further, the duty cycle may be maintained approximately 50% through out the system by making the delay of both the falling path and the rising path substantially close.

In one embodiment, an area of the level shifter circuit may be reduced due to reduced size of a P-well of the level shifter circuit which may have a smaller number of PMOS transistors as compared to a conventional level shifter circuit.

FIG. 5 is a process flow of reducing a fall path delay and a rise path delay in a level shifter circuit through an output node, a pull-up NMOS transistor and a pull-down NMOS transistor, according to one embodiment. In operation 500, the output node (e.g., OUT 120 of FIG. 4A) may be coupled to a shared node (e.g., $Q_1$ 218 of FIG. 4A) between a pull-up sub-circuit and a pull-down sub-circuit of a first set of pull-up and pull-down sub-circuits through an output inverter (e.g., 222 of FIG. 4A) to reduce a delay of a rise path of the level shifter circuit. In operation 502, the pull-up NMOS transistor (e.g., 402 of FIG. 4B) and the pull-down NMOS transistor (e.g., 404 of FIG. 4B) may be placed in the fall path of the level shifter circuit to reduce the fall path delay. In operation 504, the fall path delay and the rise path delay may be balanced to reduce an inherent duty cycle of the level shifter circuit. In operation 506, the pull-down NMOS transistor (e.g., 404 of FIG. 4B) may be placed to ensure that the level shifter circuit may operate without failure over a broader ranges of temperature, voltages and process variations.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry and/or in Digital Signal; Processor DSP circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A system, comprising:
a first circuit to operate based on a first voltage of a first power supply;
a second circuit to operate based on a second voltage of a second power supply;
a level shifter circuit between the first circuit and the second circuit to translate between the first voltage of the first power supply and the second voltage of the second power supply;
a first set of sequentially coupled pull-up and pull-down sub-circuits of the level shifter circuit cross coupled to a second set of sequentially coupled pull-up and pull-down sub-circuits of the level shifter circuit to generate a positive feedback loop;
an output node of the level shifter circuit coupled to a common node between the pull-up and the pull-down sub-circuits of the first set of sequentially coupled pull-up and pull-down sub-circuits through an output inverter;
a pull-up NMOS transistor having a gate contact coupled to an input of the second set of pull-up and pull-down sub-circuits, a source contact coupled to an input of the output inverter and a drain contact coupled to the second voltage; and
a pull-down NMOS transistor having a gate contact coupled to the input of the second set of pull-up and pull-down sub-circuits, a drain contact coupled to an output of the output inverter and a source contact coupled to a ground.

2. A level shifter circuit, comprising:
a first set of sequentially coupled pull-up and pull-down sub-circuits cross coupled to a second set of sequentially coupled pull-up and pull-down sub-circuits to generate a positive feedback loop;
an input node of the first set of sequentially coupled pull-up and pull-down sub-circuits coupled to an input node of the level shifter;
an input node of the second set of sequentially coupled pull-up and pull-down sub-circuits coupled to a logical inverse of the input node of the level shifter;
an output node coupled to a shared node between the first pull-up and pull-down sub-circuits through an output inverter;
a pull-up NMOS transistor with a gate contact coupled to the input of the second set of pull-up and pull-down sub-circuits, a source contact coupled to an input of the output inverter and a drain contact coupled to the output node; and
a pull-down NMOS transistor with a gate contact coupled to the input of the second set of pull-up and pull-down sub-circuits, a drain contact coupled to an output of the output inverter and a source contact coupled to a ground.

3. A method, comprising:
generating a positive feedback loop through a cross-coupling of a first set of sequentially coupled pull-up and pull-down sub-circuits to a second set of sequentially coupled pull-up and pull-down sub-circuits;
coupling a first set input node of the first set of sequentially coupled pull-up and pull-down sub-circuits to a level shifter input node;
coupling a second set input node of the second set of sequentially coupled pull-up and pull-down sub-circuits to a inverse logic of the level shifter input node;
coupling a level shifter output node to a shared node between a first pull-up sub-circuit and a first pull-down sub-circuit of the first set of sequentially coupled pull-up and pull-down sub-circuits through an output inverter;

placing a pull-up NMOS transistor having a gate contact coupled to the second set input node of the second set of pull-up and pull-down sub-circuits, a source contact coupled to an output inverter input node and a drain contact coupled to a level shifter output voltage; and placing a pull-down NMOS transistor with a gate contact coupled to the second set input node of the second set of pull-up and pull-down sub-circuits, a drain contact coupled to an output inverter output node and a source contact coupled to a ground.

4. A method of claim 3 further comprising placing a serially coupled pair of PMOS transistors in the first set of sequentially coupled pull-up and pull-down sub-circuits and the second set of sequentially coupled pull-up and pull-down sub-circuits.

* * * * *

UNITED STATES PATENT AND TRADEMARK OFFICE
CERTIFICATE OF CORRECTION

| | | |
|---|---|---|
| PATENT NO. | : 7,511,552 B2 | Page 1 of 1 |
| APPLICATION NO. | : 11/454063 | |
| DATED | : March 31, 2009 | |
| INVENTOR(S) | : Ali Shahid, Satheesh Balasubramanian and Sujan Manohar | |

It is certified that error appears in the above-identified patent and that said Letters Patent is hereby corrected as shown below:

ON THE TITLE PAGE:

Item (75) Inventors: Please correct to read

-- Sujan Manohar --.

Signed and Sealed this
Eleventh Day of September, 2012

David J. Kappos
*Director of the United States Patent and Trademark Office*